(12) United States Patent
Sridhara et al.

(10) Patent No.: US 10,140,180 B1
(45) Date of Patent: Nov. 27, 2018

(54) SEGMENT-BASED OUTER CODE RECOVERY

(71) Applicant: Seagate Technology LLC, Cupertino, CA (US)

(72) Inventors: Deepak Sridhara, Longmont, CO (US); Ara Patapoutian, Hopkinton, MA (US); Prafulla B Reddy, Longmont, CO (US)

(73) Assignee: Seagate Technology LLC, Cupertino, CA (US)

( * ) Notice: Subject to any disclaimer, the term of this patent is extended or adjusted under 35 U.S.C. 154(b) by 0 days.

(21) Appl. No.: 15/344,423

(22) Filed: Nov. 4, 2016

(51) Int. Cl.
*G06F 11/10* (2006.01)
*H03M 13/05* (2006.01)

(52) U.S. Cl.
CPC ......... *G06F 11/1076* (2013.01); *H03M 13/05* (2013.01)

(58) Field of Classification Search
CPC ..................... G06F 11/1076; H03M 13/05
See application file for complete search history.

(56) References Cited

U.S. PATENT DOCUMENTS

| | | | |
|---|---|---|---|
| 5,687,182 A * | 11/1997 | Shikakura | G11B 20/1833 714/704 |
| 6,154,866 A * | 11/2000 | Kawahara | G11B 20/10527 360/32 |
| 6,370,324 B1 * | 4/2002 | Kawahara | G11B 20/00007 348/705 |
| 6,526,224 B1 * | 2/2003 | Kawahara | G11B 27/005 375/E7.021 |
| 7,774,688 B1 * | 8/2010 | Teng | H03M 13/2909 714/782 |
| 7,949,927 B2 | 5/2011 | Park et al. | |
| 8,296,637 B1 * | 10/2012 | Varnica | H03M 13/1102 714/794 |
| 8,769,380 B1 | 7/2014 | Burd et al. | |
| 2004/0098661 A1 * | 5/2004 | Chuang | G11B 20/1833 714/784 |
| 2004/0205442 A1 * | 10/2004 | Chuang | G11B 20/1833 714/784 |
| 2009/0019335 A1 | 1/2009 | Boyer et al. | |
| 2009/0327832 A1 * | 12/2009 | Ichihara | G11B 20/1833 714/752 |
| 2013/0073922 A1 | 3/2013 | Varnica et al. | |
| 2015/0249471 A1 | 9/2015 | Yen et al. | |
| 2016/0191078 A1 | 6/2016 | Gilbert et al. | |

\* cited by examiner

*Primary Examiner* — Kyle Vallecillo
(74) *Attorney, Agent, or Firm* — Cesari & Reed, LLP; Kirk A. Cesari; Christian Best

(57) ABSTRACT

Systems and methods are disclosed for performing segment-based outer code recovery at a data storage device. An apparatus may comprise a circuit configured to disable outer code error recovery, and perform a read operation spanning a plurality of segments of a data storage medium, a segment including a plurality of sectors. The circuit may identify one or more segments from the plurality of segments that have one or more sectors with an error. For an identified segment of the one or more segments, the circuit may perform a re-read operation with outer code error recovery enabled, and perform outer code recovery on sectors with an error within the identified segment.

18 Claims, 5 Drawing Sheets

SEGMENT-BASED OUTER CODE RECOVERY

SUMMARY

In certain embodiments, an apparatus may comprise a circuit configured to disable outer code error recovery, and perform a read operation spanning a plurality of segments of a data storage medium, a segment including a plurality of sectors. The circuit may identify one or more segments from the plurality of segments that have one or more sectors with an error. For an identified segment of the one or more segments, the circuit may perform a re-read operation of the identified segment with outer code error recovery enabled, and perform outer code recovery on sectors with an error in the identified segment.

In certain embodiments, a method may comprise disabling outer code error recovery, and performing a read operation spanning a plurality of segments of a data storage medium, a segment including a storage area of a plurality of sectors that is not track-based. The method may include identifying one or more segments, from the plurality of segments, that have one or more sectors with an error. For an identified segment of the one or more segments, the method may include performing a re-read operation of the identified segment with outer code error recovery enabled, and performing outer code recovery on sectors with an error in the identified segment.

In certain embodiments, a device may comprise a digital communications channel configured to perform a read operation spanning a plurality of segments of a data storage medium with outer code recovery disabled, a segment including a plurality of sectors and less than a data track of a data storage medium. The channel may identify one or more segments, from the plurality of segments, that failed to read. For an identified segment of the one or more segments, the channel may perform a re-read operation with outer code error recovery enabled, and perform outer code recovery on sectors that failed to read in the identified segment.

DETAILED DESCRIPTION

In the following detailed description of certain embodiments, reference is made to the accompanying drawings which form a part hereof, and in which are shown by way of illustration of example embodiments. It is also to be understood that features of the embodiments and examples herein can be combined, exchanged, or removed, other embodiments may be utilized or created, and structural changes may be made without departing from the scope of the present disclosure.

In accordance with various embodiments, the methods and functions described herein may be implemented as one or more software programs running on a computer processor or controller. Dedicated hardware implementations including, but not limited to, application specific integrated circuits, programmable logic arrays, and other hardware devices can likewise be constructed to implement the methods and functions described herein. Methods and functions may be performed by modules, which may include one or more physical components of a computing device (e.g., logic, circuits, processors, etc.) configured to perform a particular task or job, or may include instructions that, when executed, can cause a processor to perform a particular task or job, or any combination thereof. Further, the methods described herein may be implemented as a computer readable storage medium or memory device including instructions that, when executed, cause a processor to perform the methods.

Figure 1:
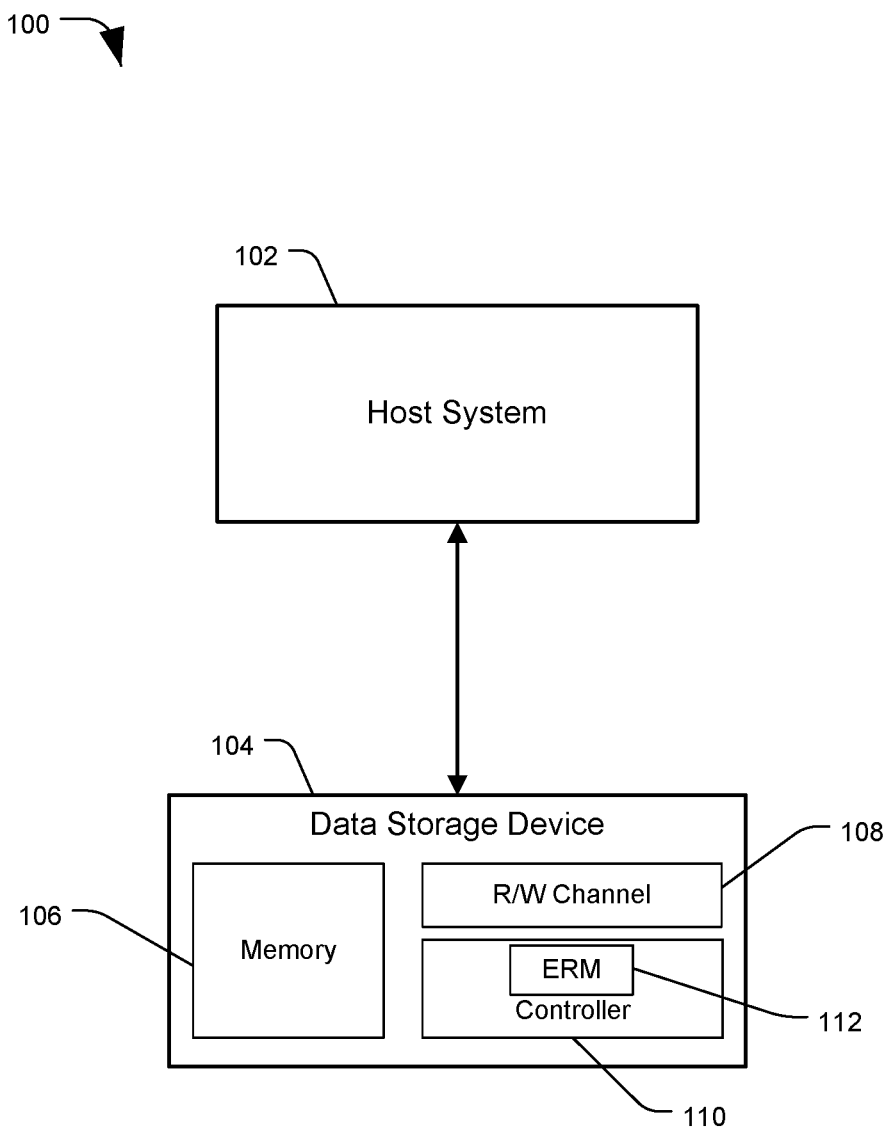
FIG. 1 is a diagram of a system configured to perform segment-based outer code recovery, in accordance with certain embodiments of the present disclosure.

FIG. 1 is a diagram of a system, generally designated 100, configured to perform segment-based outer code recovery, in accordance with certain embodiments of the present disclosure. The system 100 may include a data storage device (DSD) 104, such as a storage drive (e.g. a hard disc drive (HDD) or hybrid drive) or any other device which may be used to store or retrieve data. The system 100 may optionally include a host device 102, which may also be referred to as the host system or host computer. The host 102 can be a desktop computer, a laptop computer, a workstation, a tablet computer, a telephone, a music player, another electronic device, or any combination thereof. The host 102 and DSD 104 may be connected by way of a wired or wireless connection, or by a local area network (LAN) or wide area network (WAN). In some embodiments, the DSD 104 can be a stand-alone device not connected to a host 102 (e.g. a removable data storage device having its own case or housing), or the host 102 and DSD 104 may both be part of a single unit (e.g. a computer having an internal hard drive). The host 102 may issue data access requests, such as read or write requests, to the DSD 104. In response, the DSD 104 may perform data access operations based on the requests.

The DSD 104 may include a memory 106, a read/write (R/W) channel 108, and a controller 110. The memory 106 may comprise one or more data storage mediums, such as magnetic storage media like hard discs, solid state memory like Flash, other types of memory, or a combination thereof. The R/W channel 108 may be a digital communications channel comprising one or more circuits or processors configured to process signals for recording data to or reading data from the memory 106. The controller 110 may be a processor or circuit configured to perform data access operations, such as reads or writes, to the memory 106. Data retrieved from the memory 106, or to be stored to the memory 106, may be processed via the R/W channel 108, such as by encoding or decoding signals, detecting values from signal waveforms, or other processing.

The DSD 104 may also include an error recovery module (ERM) 112, which may be included in the controller 110, the R/W channel 108, or otherwise included in the DSD 106. During data read operations, the DSD 104 may fail to read data from the memory 106 due to errors, for example due to flaws in the physical storage medium, due to errors that occurred when the data was written, or due to errors during the read operation. The ERM 112 may be used to recover data that could not be read during a read operation. An example embodiment of system 100, including a more detailed diagram of DSD 104, is depicted in FIG. 2.

Figure 2:
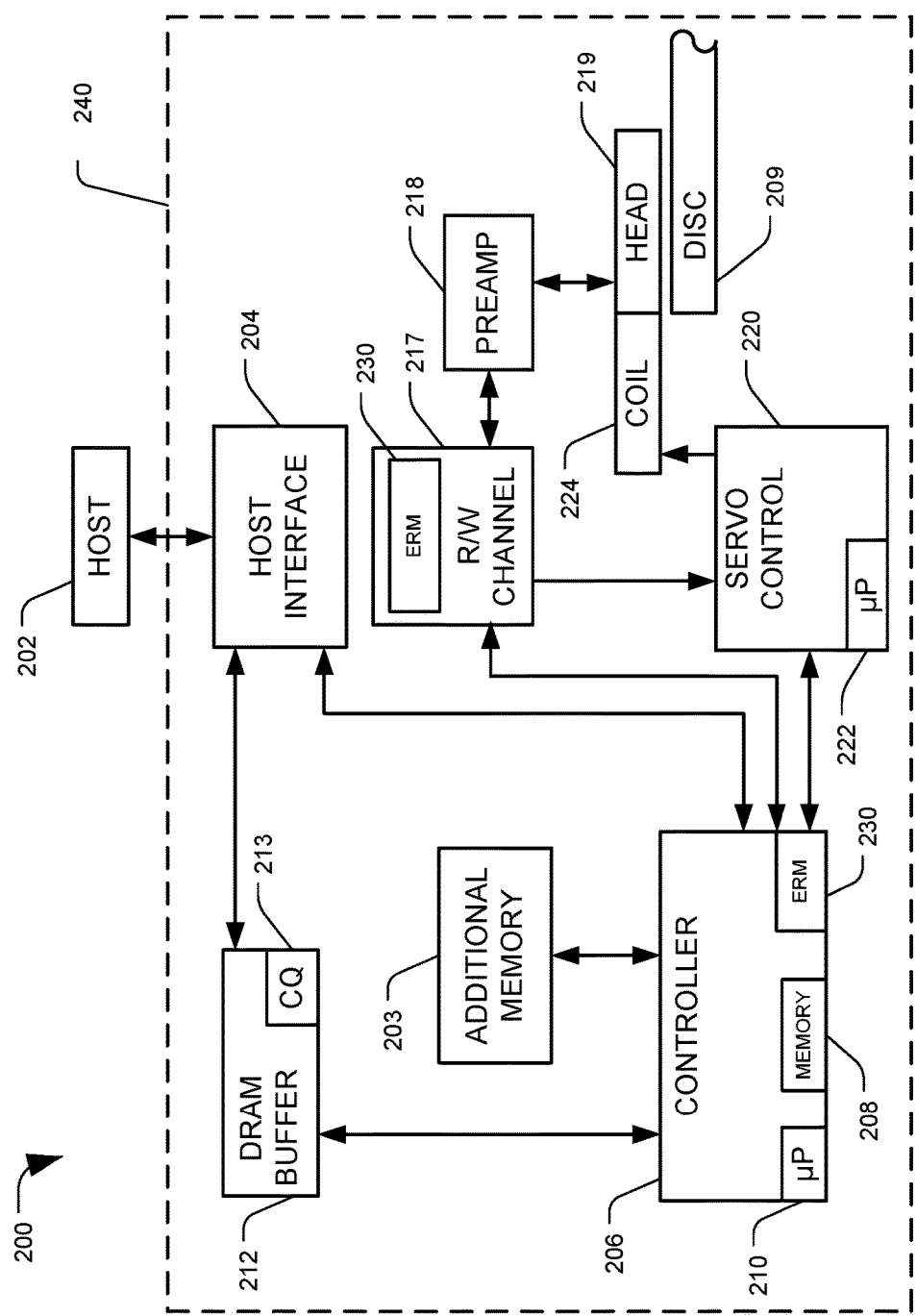
FIG. 2 is a diagram of a system configured to perform segment-based outer code recovery, in accordance with certain embodiments of the present disclosure.

FIG. 2 is a diagram of a system 200 configured to perform segment-based outer code recovery, in accordance with certain embodiments of the present disclosure. Specifically, FIG. 2 provides a functional block diagram of an example data storage device (DSD) 200. The DSD 200 can communicate with a host device 202 (such as the host system 102 shown in FIG. 1) via a hardware or firmware-based interface circuit 204. The interface 204 may comprise any interface that allows communication between a host 202 and a DSD 200, either wired or wireless, such as USB, IEEE 1394, Compact Flash, SATA, eSATA, PATA, SCSI, SAS, PCIe, Fibre Channel, Ethernet, or Thunderbolt, among others. The interface 204 may include a connector (not shown) that allows the DSD 200 to be physically removed from the host 202. The DSD 200 may have a casing 240 housing the components of the DSD 200. The DSD 200 may communicate with the host 202 through the interface 204 over wired or wireless communication.

The buffer 212 can temporarily store data during read and write operations, and can include a command queue (CQ) 213 where multiple pending operations can be temporarily stored pending execution. Commands arriving over the interface 204 may automatically be received in the CQ 213 or may be stored there by controller 206, interface 204, or another component.

The DSD 200 can include a programmable controller 206, which can include associated memory 208 and processor 210. The controller 206 may control data access operations, such as reads and writes, to one or more disc memories 209, or to additional memories 203. The DSD 200 may include the additional memory 203 instead of or in addition to disc memory 209. For example, additional memory 203 can be a solid state memory, which can be either volatile memory such as DRAM or SRAM, or non-volatile memory, such as NAND Flash memory. The additional memory 203 can function as a cache and store recently or frequently read or written data, or data likely to be read soon. Additional memory 203 may also function as main storage instead of or in addition to disc(s) 209. A DSD 200 containing multiple types of nonvolatile storage mediums, such as a disc(s) 209 and Flash 203, may be referred to as a hybrid storage device.

The DSD 200 can include a read-write (R/W) channel 217, which can encode data during write operations and reconstruct user data retrieved from a memory, such as disc(s) 209, during read operations. A preamplifier circuit (preamp) 218 can apply write currents to the head(s) 219 and provides pre-amplification of read-back signals. In some embodiments, the preamp 218 and head(s) 219 may be considered part of the R/W channel 217. A servo control circuit 220 may use servo data to provide the appropriate current to the coil 224, sometimes called a voice coil motor (VCM), to position the head(s) 219 over a desired area of the disc(s) 209. The controller 206 can communicate with a processor 222 to move the head(s) 219 to the desired locations on the disc(s) 209 during execution of various pending commands in the command queue 213.

DSD 200 may include an error recovery module (ERM) 230. The ERM 230 may perform the methods and processes described herein to recover or reconstruct data that was not successfully read. Various error recovery techniques may be applied by the ERM 230, including attempting to mathematically reconstruct failed bits or sectors using error recovery data such as error correction code (ECC) parity bits. ECC may include a process or algorithm for adding redundant or parity data to a data sequence, so that the data sequence can be recovered even when a number of errors (up to the capability of the code) is encountered when reading the data. When host or user data is stored to a memory, additional ECC information may also be stored, such as parity data that is computed based on the stored host or user data. If certain bits or sectors are not successfully read, the ERM 230 may use the parity data, combined with the successfully read bits or sectors, to calculate or reconstruct the "missing" failed bits or sectors. Examples of ECC may include inner code (IC) and outer code (OC). IC may be calculated based on individual sectors, and IC parity bits may be stored for each sector (e.g. within the sector itself). If a sector fails to decode, the IC parity bits and successfully detected user or host data bits may be used to determine the value of bits that were not successfully read, and thereby recover the sector. OC data, on the other hand, may be calculated based on all sectors of a track or other data segment, and may be used to recover sectors that are otherwise unrecoverable using inner code. One or more OC parity sectors may be stored to the track or data segment. When a sector in the track or segment fails to decode, the ERM 230 may read the entire track or segment, and use the OC parity sectors and the successfully read sectors to reconstruct the failed sectors within the segment. Iterative outer code (IOC) processes may include iterating between inner code recovery and outer code recovery to rebuild and recover more data than could be recovered by either process alone. Various error correction algorithms may have a limit to how many errors can be corrected, for example based on how many error correction parity bits are stored per user data bit. This limit may be referred to as an "error correction capability" of the correction scheme or DSD 200. As an example, an OC error correction scheme employed by the DSD 200 may be capable of recovering four sectors per track. If more than four sectors on a track are unable to be read, the error correction may fail. Other types of error recovery processes may also be controlled by the ERM 230, such as re-read attempts, read head offsets, and adjacent track interference cancellation operations.

The ERM 230 may be a processor, controller, or other circuit, or it may be a set of software instructions that, when executed by a processing device, perform the functions of the ERM 230. In some embodiments, the ERM 230 may be part of or executed by R/W channel 217, part of or executed by the controller 206, included in or performed by other components of the DSD 200, a stand-alone component, or any combination thereof. The ERM 230 may be configured to perform error recovery using OC data, for both track-based OC blocks as well as segment-based OC blocks. An OC block may be a set of sectors for which OC parity sectors are computed, such as a segment or track. The operation of the ERM 230 and segment-based OC recovery are discussed in further detail in regard to FIG. 3.

Figure 3:
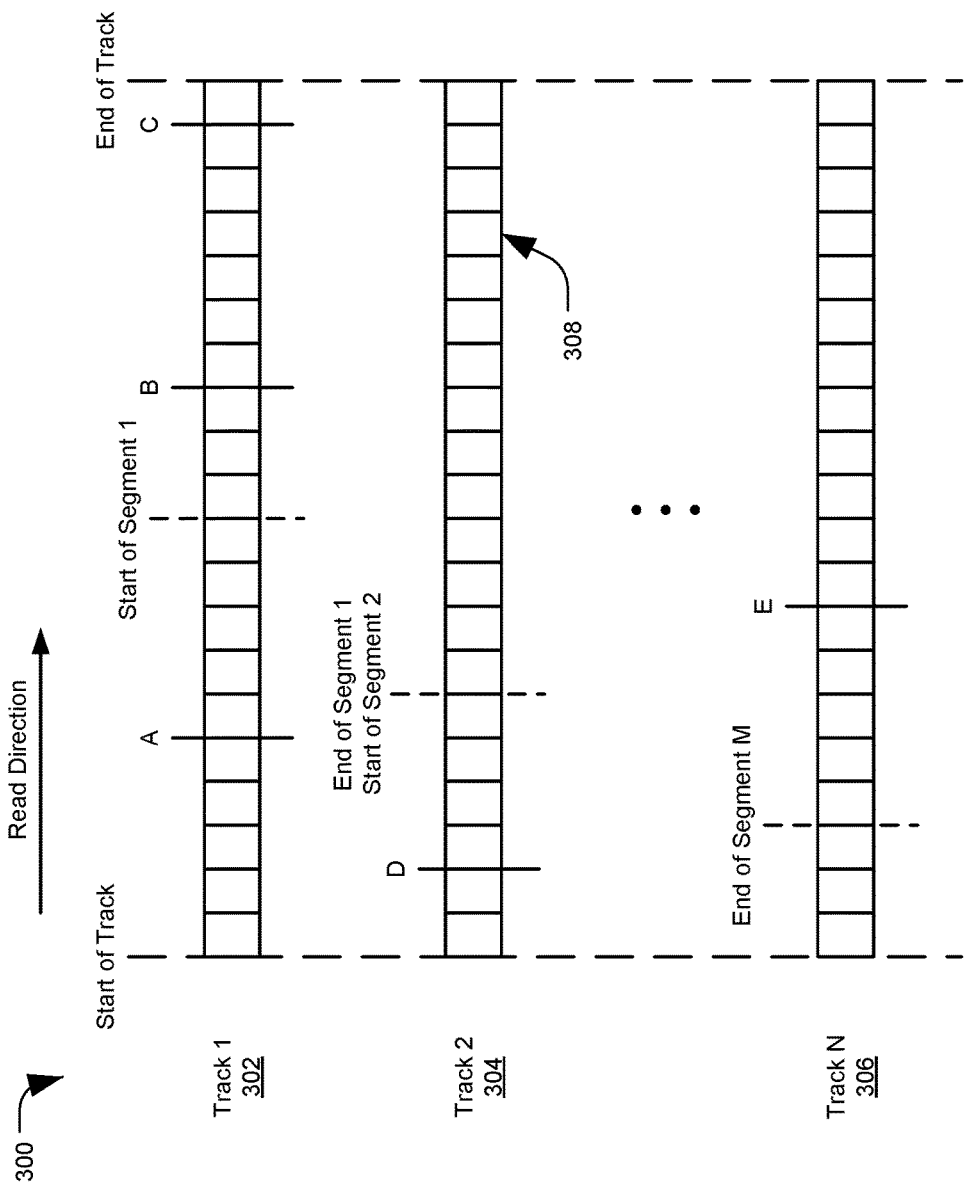
FIG. 3 is a diagram of a system configured to perform segment-based outer code recovery, in accordance with certain embodiments of the present disclosure.

FIG. 3 is a diagram of a system configured to perform segment-based outer code recovery, in accordance with certain embodiments of the present disclosure. In particular, FIG. 3 depicts an example set of tracks 300 of a data storage medium, such as a magnetic disc, with each track including a plurality data sectors 308.

As discussed above, OC parity data may be generated and stored on a per-track basis, such that the parity data may be computed based on the data from all sectors of a track, and recovery via OC may require reading a full track. This may be referred to as track-based OC parity. Updating the data stored to a track may include recalculating and updating the OC parity data.

However, track-based OC parity may be inefficient to implement in certain storage implementations of a DSD. For example, shingled magnetic recording (SMR) drives may employ a recording scheme such that each track partially overlaps the preceding track, like roofing shingles, in order to increase the recording density. However, SMR may have the limitation of only recording tracks in a single direction (e.g. inner diameter to outer diameter or vice versa) in order to avoid partially overwriting data from both directions and rendering the data unreadable. Therefor individual tracks may not be randomly written, but instead "bands" of multiple adjacent tracks are rewritten at all once. As rewriting bands of tracks may be time consuming, SMR drives may employ a media cache zone where random data writes are temporarily stored to a memory such as a disc, and then the random data may be organized and recorded to the target SMR bands efficiently. Media caches may be used to temporarily store data to a nonvolatile memory in other storage device implementations as well.

The random writes temporarily stored to a media cache may include host writes of variable lengths, not necessarily corresponding to a full track. Sectors of a storage medium may have a corresponding logical block address (LBA) or other logical addressing value. In some storage device implementations, for the majority of a storage medium, consecutive sectors may be assigned consecutive LBAs, such that a range of consecutive LBAs may be read or written during a single traversal of a track by a transducer head. Other portions of a storage medium may be reserved as a media cache to temporarily store updated data prior to writing the data to its ultimate destination. A random write may be for a set of consecutive LBAs, and the media cache region may have multiple unrelated sets of LBAs stored together. If data corresponding to an LBA in the media cache is requested before the data is transferred to its ultimate destination, the most recent version of the data may instead be retrieved from the media cache.

Zones or areas of a storage medium in which unrelated data streams are stored, such as a media cache, may be referred to as segment-based zones or isochronous (ISO) zones. Data in segment-based zones may be written in multiples of a segment size, which are typically not track-based. A segment may be a grouping of a plurality of sectors that can be longer than a track or shorter than a track, and may span one or more track boundaries. A segment can be 1 MB of data for example, and may include one or more sector's worth of data. A DSD may be configured to employ uniform or variable-length segment sizes. For example, a drive may have a set of possible choices for segment sizes (e.g. 1 MB, 2 MB, 8 MB, 16 MB, etc.), and the drive may select a segment size based on workloads to optimize performance during writes and reads. A sequence of consecutive LBAs may be stored to one or more segments of the ISO zone. A segment may form an outer code block (e.g., OC parity sectors may be computed based on all the data in the segment and stored to the segment).

The set of tracks 300 may correspond to a portion of an ISO zone, and may include N tracks numbered track 1 302, track 2 304, up through track N 306. The tracks 300 may include M segments, numbered segment 1, segment 2, up through segment M. Read operations, such as in response to a read command from a host, may span track boundaries, segment boundaries, or both. For example, a read from position A to B may span a segment boundary (from outside segment 1 into segment 1) but not a track boundary. A read from B to C may be contained within both a segment boundary and a track boundary. A read from A to E may span both segment boundaries and track boundaries. A read from B to D may span a track boundary but not a segment boundary. Reads spanning segment boundaries may present difficulties in performing OC recovery, based on how OC recovery is performed.

Performing OC error correction may include reading the data from each sector in an OC block. When a sector is successfully read, OC syndrome information for that sector is collected and added to a syndrome state or syndrome block, while failed sectors are not added to the syndrome state. A syndrome state may be a linear combination of the sectors of the OC block, and is a compact representation of the errors in the OC block. A syndrome state may include a value derived from the sectors in an OC block, and from which the value of failed sectors may be determined during OC error correction. Collecting and adding syndrome information to the syndrome state may be referred to as a syndrome update process. The syndrome state may be stored to a register or other memory, and may be initialized to 0 or a null value (e.g. 'zeroed out'). When a sector is successfully read or decoded, syndrome information for that sector may be combined into the syndrome state, such as via an XOR operation. When the entire OC block has been read, the data from a number of failed sectors up to the EC capability of the OC algorithm employed may be computed or recovered based on the syndrome state. However, if information from sectors outside the OC block are added to the syndrome state, the syndrome state can become contaminated and cannot be used to recover failed sectors. As an example, an OC block may have a single OC parity sector that is an XOR of all host sectors in the OC block. The syndrome state may be an XOR of all successfully recovered sectors during a read operation. If all sectors are successfully read, the syndrome state may be all 0's, indicating a valid code word. If the syndrome state is non-zero, it may provide information about the errors, and may be used to recover data from a failed sector.

Accordingly, for a read that crosses over a segment boundary, such as a read from B to E, the DSD hardware may not have time to transfer the syndrome state of the current segment to another storage location and zero out the syndrome state when crossing over the segment boundary to read the sectors in the next segment. Thus, if syndrome updating in the hardware is turned ON during the read, there is a chance of the syndrome state getting contaminated with data from multiple segments, and becoming unusable for recovering failed sectors. However, if syndrome updating is turned OFF, then OC correction may not be employed. In addition, some DSDs may halt a read after encountering more failed sectors than can be buffered for delayed error correction processing (e.g. using IC error correction and other techniques besides OC recovery) if syndrome updating (and OC recovery) is turned off. A method of segment-based outer code recovery addressing these issues is discussed in regard to FIG. 4.

Figure 4:
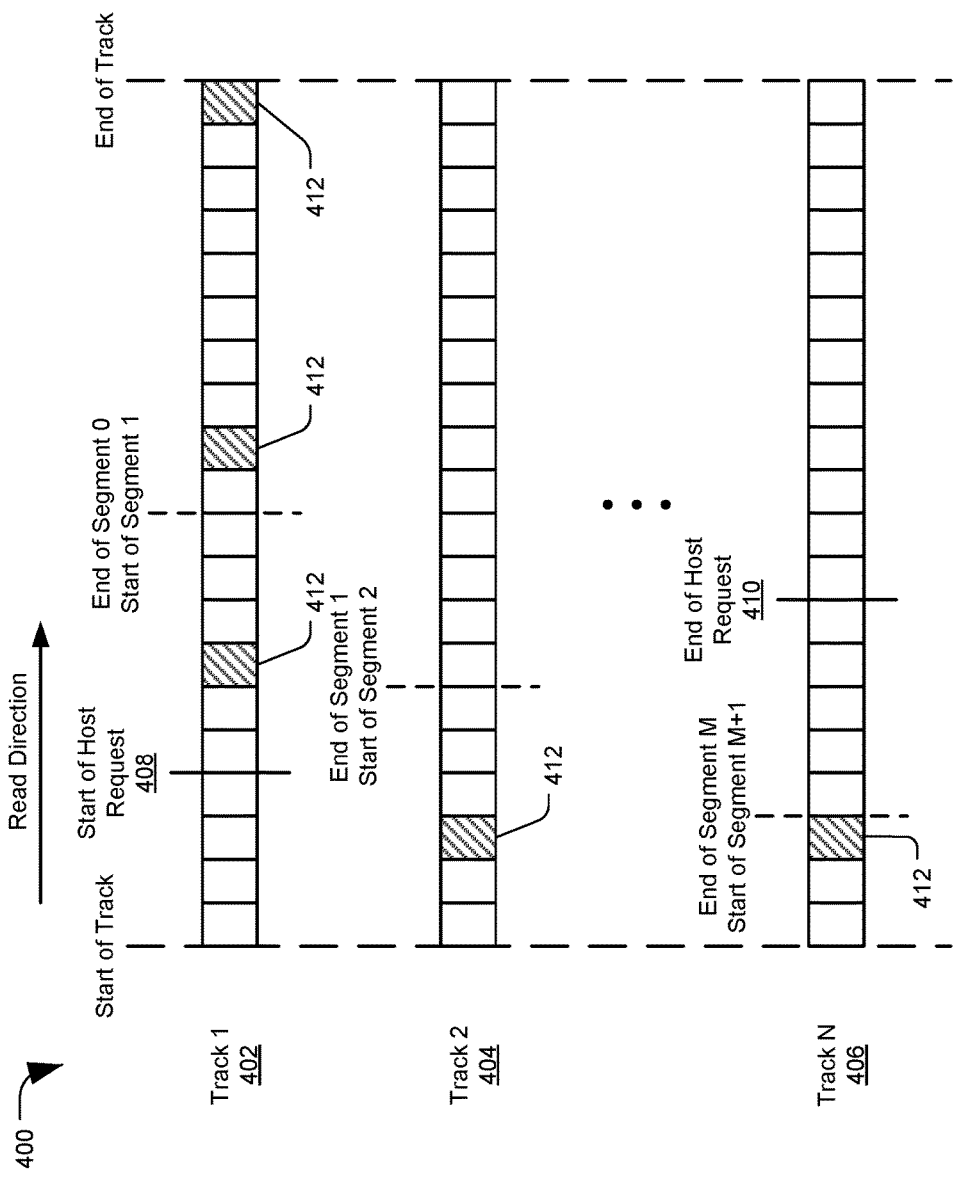
FIG. 4 is a diagram of a system configured to perform segment-based outer code recovery, in accordance with certain embodiments of the present disclosure.

FIG. 4 is a diagram of a system configured to perform segment-based outer code recovery, in accordance with certain embodiments of the present disclosure. In particular, FIG. 4 depicts an example set of tracks 400 of a data storage medium, such as a magnetic disc, with each track including a plurality data sectors. As in FIG. 3, the set of tracks 400 may include an ISO zone having N tracks, including track 1 402, track 2 404, and up through track N 406. The N tracks may include a plurality of segments, including segment 0, segment 1, segment 2, segment M, and segment M+1.

An ERM of the DSD may perform segment-based outer code error recovery on the set of tracks 400. The error recovery may include disabling outer code error recovery, including syndrome updating, prior to performing a read operation spanning a plurality of segments from the set of tracks 400, a segment including a plurality of sectors. When the read is performed, the ERM may identify one or more segments, from the plurality of segments, that have one or more sectors with an error. For each identified segment of the one or more segments, the ERM may perform a re-read operation of the identified segment with outer code error recovery enabled. An example segment-based outer code recovery process is described in greater detail below.

A host may issue a read request to a DSD requesting the data associated with a sequence of LBAs. The most recent version of the data associated with the sequence of LBAs may be stored in the set of tracks 400 of the media cache, and may span multiple segments. The host request may begin at position 408 in segment 0, and continue through to position 410 of segment M+1. Accordingly, the read operation may span multiple segment boundaries. During the read operation, failed sectors 412 may be encountered at the shaded sectors of FIG. 4. These failed sectors 412 may be located in multiple segments.

The OC syndrome update process may first be disabled before performing the read. For example, the ERM may not update the syndrome state based on successfully decoded sectors, or the syndrome state may be updated but not used for any error correction in case of cross-segment contamination. The ERM may only disable the syndrome update process for reading sectors stored to an ISO zone, rather than for all reads (e.g. reads including track-based OC block zones).

With the syndrome update disabled, a read operation for the requested data may be performed from the start of the host request 408 to the end of the host request 410. The error recovery module (ERM) may be configured to perform certain error recovery operations during the read when errors are encountered, such as IC recovery operations. Successfully read or recovered data may be stored to a read buffer for later delivery to the host. If a sector read fails and the sector is not recovered via the employed recovery operations, the ERM may note the location of the failed sector 412. For example, the ERM may store to memory identifiers for the segment and a sector offset within the segment, an LBA of the failed sector, or other information identifying failed sectors and associated segments. The DSD may be configured to continue the read operation until it has attempted to read all sectors of the host request. The DSD may continue to attempt to read all requested sectors even if a large number of failed sectors 412 are encountered, as the ERM may still recover the failed sectors via OC recovery later in the error recovery process. For example, the DSD may have an operating mode causing the DSD to read a range of LBAs and not halt irrespective of the number of the sectors that fail during the read. The DSD may discard a failed sector after a time limit is reached on trying to recover the sector, such as when a read-gate is being raised on the next sector and the hardware has to start working on recovering the next sector. Once the read has been completed and the ERM knows the locations of the failure sectors 412 in the multiple segments, the ERM can initiate recovery attempts on the failed sectors 412.

The ERM may then identify the segments which include failures. For example, segments 0, 1, and M include at least one failed sector 412 in FIG. 4. The ERM may optionally attempt error recovery methods that do not include OC or IOC recovery for these sectors, such as re-reads with different head offsets, SERV sample averaging, IC recovery, adjacent track interference (ATI) cancellation, or other operations.

When the ERM determines to perform OC or IOC recovery on the failed sectors 412, the ERM may select a segment including a failed sector 412 (e.g. segment 0). The ERM may enable syndrome updates, and zero out the syndrome state. The ERM may then perform a syndrome-generation read for the selected segment. The ERM may read every sector of the selected segment, or may skip the known failed sectors (e.g. by generating a skip mask for the selected segment, with a sequence of set bits or flags stored to a register and indicating which sectors to read and which sectors to skip without reading). The successfully decoded sectors may be used to update the syndrome state for the selected segment, without contamination from sectors outside the segment. The ERM may then perform OC or IOC recovery procedures to attempt to recover any failed sectors 412 in the selected segment. Data from the recovered sectors may be stored to the read buffer along with data for sectors previously read successfully. Other sectors which were previously successfully read may already be stored in the read buffer and may not need to be stored again or updated. After performing OC or IOC recovery on the selected segment, the ERM may then determine whether any other segments in the host request include failed sectors 412. If so, the ERM may repeat the process for each subsequent segment including one or more failed sectors 412. A flowchart of the method described above is provided in FIG. 5.

Figure 5:
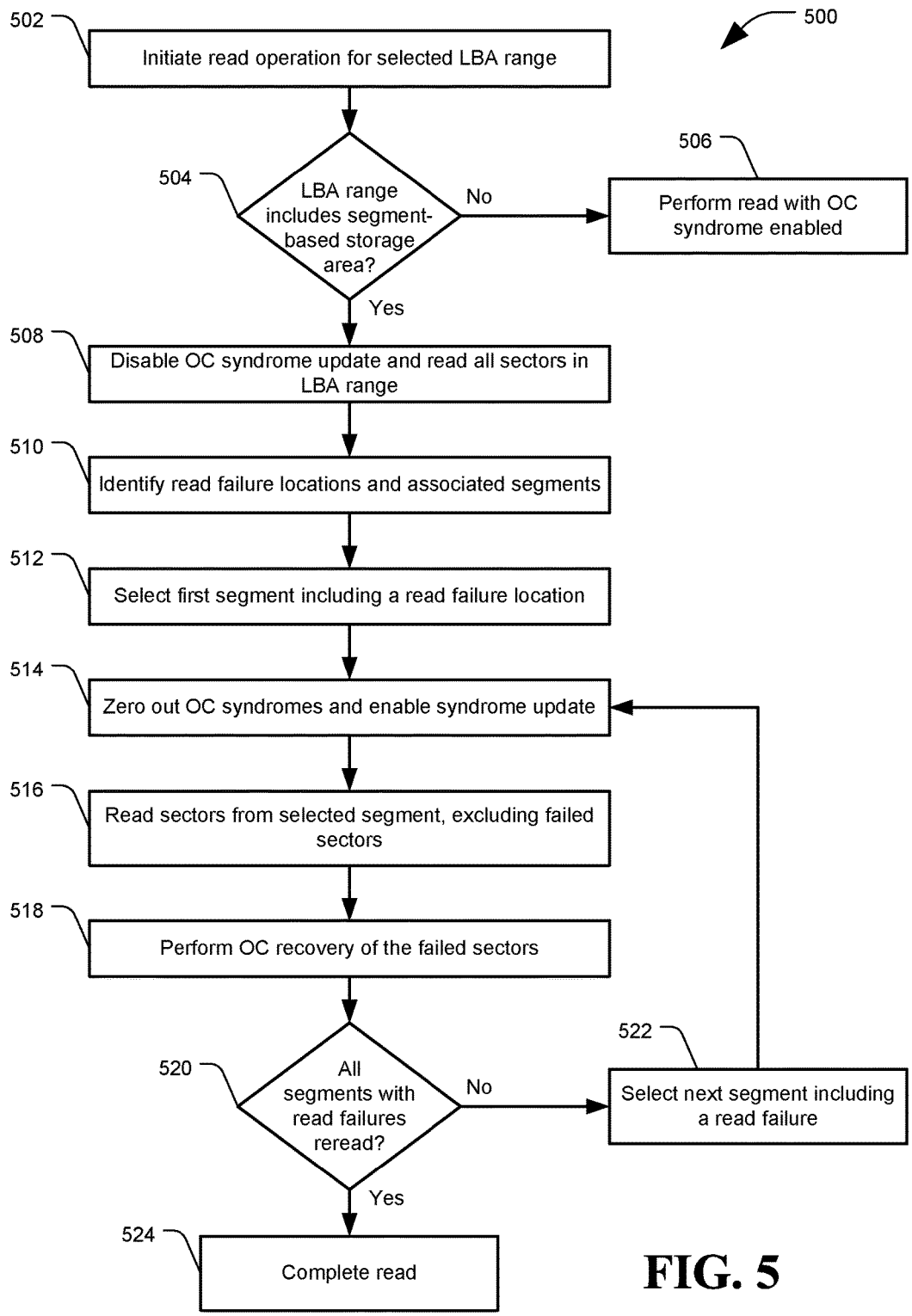
FIG. 5 is a flowchart of a method of segment-based outer code recovery, in accordance with certain embodiments of the present disclosure.

FIG. 5 is a flowchart of an example method 500 of performing segment-based outer code recovery, in accordance with certain embodiments of the present disclosure. The method 500 may be performed by one or more components of a data storage device (DSD), such as an error recovery module (ERM).

The method 500 may include initiating a read operation for a selected LBA range or range of sectors, at 502. The read operation may be performed in response to a read request for a host device, or for other purposes, such as an idle period transfer of data from a media cache zone to an ultimate destination location for the data.

The method 500 may include determining whether reading the selected LBA range includes retrieving data from a segment-based storage area (e.g. an ISO zone), at 504. As described above, a segment-based storage area may include a storage zone where the OC blocks, for which OC parity sectors are calculated, correspond to a segment having a size or capacity of a plurality of sectors not corresponding to data tracks. In addition to disc memories, the described techniques can be applied in any storage layout where the outer code blocks or segments fall in the middle of a storage unit that is being read and where there is no time to save syndromes when transitioning from one segment to another. If accessing the LBA range does not include reading from a segment-based storage area, the method 500 may include performing the read operation with OC syndrome update enabled, at 506.

If accessing the LBA range does include reading from a segment-based storage area, at 504, the method 500 may include disabling OC syndrome updates and attempting to read all sectors in the selected LBA range, at 508. For example, disabling the OC syndrome updates may include setting a register value in a R/W channel of the DSD, so that the syndrome information for read sectors is not used to update a syndrome state, or so that the syndrome state is updated but not accessed for error recovery. The read operation may include reading data from multiple segments and attempting to read all sectors of the selected LBA range without halting, even if failed sectors are encountered. Some error correction operations, such as IC recovery, may be performed during the initial read or prior to performing any re-read attempts for OC or IOC recovery. The ERM may identify and store read failure locations, such as sectors that could not be successfully read or corrected, and segments associated with those read failure locations, at 510.

After completing the first read attempt, the method 500 may include the ERM selecting a first segment including a read failure location, at 512. The ERM may zero out OC syndrome data at 514, to ensure no residual syndrome data contaminates the syndrome state for the following operation. Also at 514, the ERM may enable syndrome updates.

The method 500 may include reading sectors from the selected segment, at 516. Optionally, reading the selected segment may include not reading any known failed sectors. Previously failed sectors may be skipped because the DSD may perform certain error recovery operations (e.g. IC recovery) during the current read, and attempting to read and correct known unreliable sectors may cause delay. Also, sectors that have already been successfully recovered may already be cached in a read cache for returning to a host, so caching may be disabled for the OC recovery re-read. If a previously failed sector is successfully read during the re-read when caching is disabled, the sector may not be stored to the read cache without complicating the process. However, read caching may be enabled during the re-read and all sectors may attempted to be read, regardless of whether those sectors failed to converge on the first read.

The ERM may then perform OC recovery for any failed sectors in the selected segment based on the syndrome state, at 518. The failed sectors may include sectors that could not be read during the first read attempt, during the segment-based re-read operation, or both. In some embodiments the ERM may perform iterative outer code (IOC) error correction techniques, iterating between inner code and outer code correction to progressively reconstruct failed sectors. An embodiment of iterative outer code correction is described in U.S. Pat. No. 9,015,549, titled "Iterating Inner and Outer Codes for Data Recovery", the contents of which are hereby incorporated by reference in their entirety. Recovered data from the failed sectors may be stored to a read buffer, for example to send to a host device once the requested LBA range has been retrieved.

At 520, the method 500 may include determining whether all segments with read failures have been re-read. If not, the method 500 may include selecting a next segment including a read failure, at 522, and repeating the OC correction process at 514. Once all segments with read failures have been re-read, the method 500 may include completing the read operation, at 524.

The illustrations of the embodiments described herein are intended to provide a general understanding of the structure of the various embodiments. The illustrations are not intended to serve as a complete description of all of the elements and features of apparatus and systems that utilize the structures or methods described herein. Many other embodiments may be apparent to those of skill in the art upon reviewing the disclosure. Other embodiments may be utilized and derived from the disclosure, such that structural and logical substitutions and changes may be made without departing from the scope of the disclosure. Moreover, although specific embodiments have been illustrated and described herein, it should be appreciated that any subsequent arrangement designed to achieve the same or similar purpose may be substituted for the specific embodiments shown.

This disclosure is intended to cover any and all subsequent adaptations or variations of various embodiments. Combinations of the above embodiments, and other embodiments not specifically described herein, will be apparent to those of skill in the art upon reviewing the description. Additionally, the illustrations are merely representational and may not be drawn to scale. Certain proportions within the illustrations may be exaggerated, while other proportions may be reduced. Accordingly, the disclosure and the figures are to be regarded as illustrative and not restrictive.

What is claimed is:

1. An apparatus comprising:
    a circuit configured to:
        disable outer code error recovery;
        perform a read operation spanning a plurality of segments of a data storage medium, a segment including a plurality of sectors;
        identify one or more segments, from the plurality of segments, that have one or more sectors with an error;
        for an identified segment of the one or more segments, perform a re-read operation of the identified segment with outer code error recovery enabled, the re-read operation includes reading all sectors of the identified segment except for sectors with an error; and
        perform outer code recovery on the sectors with an error in the identified segment.

2. The apparatus of claim 1 comprising the circuit further configured to:
    zero out a syndrome state for the identified segment, the syndrome state being a value derived from sectors of the identified segment;
    update the syndrome state with information from sectors of the identified segment obtained during the re-read operation; and
    perform the outer code recovery based on the syndrome state.

3. The apparatus of claim 1 comprising the circuit further configured to:
    determine a range of sectors to read during the read operation;
    determine whether the range of sectors are located in a segment-based zone of a data storage medium;
    disable the outer code recovery when the range of sectors are located in the segment-based zone; and
    do not disable the outer code recovery when the range of sectors are not located in the segment-based zone.

4. The apparatus of claim 3 further comprising:
    the data storage medium includes a magnetic disc; and
    the circuit further configured to record data to the magnetic disc using shingled magnetic recording.

5. The apparatus of claim 1 further comprising:
    a segment includes a storage area not defined by a data track of a data storage medium.

6. The apparatus of claim 1 comprising the circuit further configured to:
    perform iterative outer code recovery on the sectors with an error in the identified segment, iterative outer code recovery including iterating between outer code recovery and inner code recovery.

7. The apparatus of claim 1 comprising the circuit further configured to:
    repeat the re-read operation and outer code recovery for each segment of the one or more segments.

8. The apparatus of claim 1 comprising the circuit further configured to:
perform error recovery methods not including outer code recovery prior to performing the re-read operation.

9. The apparatus of claim 1 comprising the circuit further configured to:
perform the read operation further includes attempting to read all sectors requested in the read operation without halting due to failed sector reads.

10. A method comprising:
determining a range of sectors to read during a read operation;
determining whether the range of sectors are located in a segment-based zone of a data storage medium, a segment including a storage area of a plurality of sectors that is not track-based;
not disabling outer code recovery to perform the read operation when the range of sectors are not located in the segment-based zone;
when the range of sectors are located in the segment-based zone, perform the read operation including:
disabling outer code error recovery;
performing the read operation spanning a plurality of segments of the segment-based zone;
identifying one or more segments, from the plurality of segments, that have one or more sectors with an error;
for an identified segment of the one or more segments, performing a re-read operation of the identified segment with outer code error recovery enabled; and
performing outer code recovery on sectors with an error in the identified segment.

11. The method of claim 10 further comprising:
zeroing out a syndrome state for the identified segment, the syndrome state being a value derived from sectors of the identified segment;
updating the syndrome state with information from sectors of the identified segment obtained during the re-read operation; and
performing the outer code recovery based on the syndrome state.

12. The method of claim 10 further comprising:
performing iterative outer code recovery on the sectors with an error in the identified segment, including iterating between outer code recovery and inner code recovery.

13. The method of claim 10 further comprising:
the re-read operation includes reading all sectors of the identified segment except for the sectors with an error,
repeating the re-read operation and outer code recovery for each segment of the one or more segments.

14. A device comprising:
a digital communications channel configured to:
perform a read operation spanning a plurality of segments of a data storage medium with outer code recovery disabled, including attempting to read all sectors requested in the read operation without halting due to failed sector reads, a segment including a plurality of sectors and less than a data track of a data storage medium;
identify one or more segments, from the plurality of segments, that failed to read;
for an identified segment of the one or more segments, perform a re-read operation with outer code error recovery enabled; and
perform outer code recovery on sectors that failed to read in the identified segment.

15. The device of claim 14 comprising the digital communications channel further configured to:
zero out a syndrome state for the identified segment, the syndrome state being a value derived from sectors of the identified segment;
update the syndrome state with information from sectors of the identified segment obtained during the re-read operation; and
perform the outer code recovery based on the syndrome state.

16. The device of claim 15 further comprising:
perform the read operation further includes attempting to read all sectors requested in the read operation without halting due to failed sector reads;
the re-read operation includes reading all sectors of the identified segment except for the sectors with an error; and
the digital communications channel further configured to repeat the re-read operation and outer code recovery for each segment of the one or more segments.

17. The device of claim 16 comprising the digital communications channel further configured to:
determine a range of sectors to read during the read operation;
determine whether the range of sectors are located in a segment-based zone of the data storage medium;
disable the outer code recovery when the range of sectors are located in the segment-based zone; and
do not disable the outer code recovery when the range of sectors are not located in the segment-based zone.

18. The device of claim 17 comprising the digital communications channel further configured to:
perform iterative outer code recovery on the sectors that failed to read in the identified segment, iterative outer code recovery including iterating between outer code recovery and inner code recovery.

* * * * *